(12) United States Patent
Livneh et al.

(10) Patent No.: US 6,452,189 B1
(45) Date of Patent: Sep. 17, 2002

(54) AMMONIUM NICKEL SULFATE CRYSTALS

(75) Inventors: Shai Livneh, Fair Lawn, NJ (US); Sergey Selin, Spring Valley, NY (US); Ilya Zwieback, New Milford; Warren Ruderman, Demarest, both of NJ (US)

(73) Assignee: Inrad, Northvale, NJ (US)

( * ) Notice: Subject to any disclaimer, the term of this patent is extended or adjusted under 35 U.S.C. 154(b) by 0 days.

(21) Appl. No.: 09/488,816

(22) Filed: Jan. 20, 2000

(51) Int. Cl.[7] .............................. G02B 5/20; G01J 5/08; C30B 29/16
(52) U.S. Cl. .................. 250/372; 359/350; 117/937; 117/944
(58) Field of Search ..................... 250/372; 359/350; 117/68, 937, 944

(56) References Cited

U.S. PATENT DOCUMENTS

| | | | | |
|---|---|---|---|---|
| 4,597,629 A | * | 7/1986 | Kraushaar et al. | 359/358 |
| 4,731,881 A | * | 3/1988 | Geller | 359/189 |
| 5,574,286 A | * | 11/1996 | Huston et al. | 250/372 |
| 5,742,428 A | * | 4/1998 | Singh et al. | 359/350 |
| 5,788,765 A | * | 8/1998 | Singh et al. | 117/38 |
| 5,837,054 A | * | 11/1998 | Singh et al. | 117/10 |

OTHER PUBLICATIONS

Mookheri, A. et al. "Optical Absorption of nickel (II) Ions in Crystals", Indian Journal of Physics, 1968, vol. 42, No. 4, p. 260–5. (abstract) HCAPLUS [online]. [retrieved on Oct. 22, 2001]. Retrieved from: HCAPLUS. Accession No. 1969:82648.*

* cited by examiner

Primary Examiner—Constantine Hannaher
Assistant Examiner—Albert Gagliardi
(74) Attorney, Agent, or Firm—Stroock & Stroock & Lavan LLP

(57) ABSTRACT

Single crystals of $(NH_4)_2Ni(SO_4)_2 \cdot 6H_2O$ represent an excellent material for filtering UV light and in an enclosed system will not deteriorate at temperatures as high as 125° C. They are particularly useful in solar-blind optical systems and sensing devices, which seek to identify the presence of UV light sources in the UV missile warning band.

6 Claims, 4 Drawing Sheets

AMMONIUM NICKEL SULFATE CRYSTALS

BACKGROUND OF THE INVENTION

The invention relates generally to crystals that allow selected wavelengths of light to pass therethrough, and more particularly, to optical band-pass or rejection filters that operate in the ultraviolet (UV) spectrum.

A variety of optical devices utilize optical band-pass filters or rejection filters, which serve to reject unwanted wavelengths and permit only wavelengths belonging to a selected spectral band to pass therethrough. Crystals that serve as rejection or band-pass filters in the UV portion of the spectrum can be used for various applications, including solar-blind optical systems and missile warning systems. The following references discuss crystals and/or missile detection systems and are incorporated herein by reference: U.S. Pat. Nos. 5,742,428, 5,788,765 and 5,837,054; and MHC Pryce et al, "Low-temperature Absorption of Nickel Fluorosilicate Crystals", *Philos. Mag.,* 10, 447 (1964).

The light emitted from the exhaust of a jet engine of a missile comprises a broad spectrum, ranging from the infrared to the UV. Thus, a UV filter is needed to enable the system to distinguish this source of UV light from other natural sources of UV energy, such as the sun, moon and stars.

Crystals of nickel sulfate hexahydrate (chemical formula $NiSO_4.6H_2O$) have been used as components for such UV filters. In the UV portion of the spectrum, this crystal is transparent at wavelengths less than 300 nm and absorbs light having wavelengths greater than 350 nm. However, such crystals have drawbacks. For example, it is advantageous for an optical system used to detect the UV signal characterizing the jet engine of a missile to operate at various climate conditions, including those associated with elevated temperatures, which might be experienced in the desert. Also, temperatures of 85° C. or higher and low relative humidity conditions can be reached when aboard an aircraft, armored vehicle or a ship, as a combined result of both solar heating and engine-generated heat. Thus, the crystal should have not only proper spectral transmission but thermal stability.

The low thermal stability of $NiSO_4.6H_2O$ crystals can represent a disadvantage. When heated above 60–65° C., the material begins to lose its water of crystallization. This limits its use in UV filters. Accordingly, it is desirable to provide a crystal having optical properties similar to that of $NiSO_4.6H_2O$, but having greater thermal stability.

SUMMARY OF THE INVENTION

Generally speaking, in accordance with the invention, crystals are provided having good optical transmission at wavelengths below 300 nm and strong optical absorption at wavelengths greater than 350 nm as well as high thermal stability. The specific thermal stability is dependent on the relative humidity. At a relative humidity of 40%, the crystals are stable at temperatures up to 90° C. At a relative humidity of greater than 60%, the crystals will have a thermal stability greater than 110° C. In an enclosed environment, the thermal stability of the crystal is higher than 125° C. An example of such a crystal is ammonium nickel sulfate, having the formula $(NH_4)_2Ni(SO_4)_2.6H_2O$. Optical devices including missile detection systems are also provided.

Accordingly, it is an object of convention to provide an improved UV transmission crystal.

Another object of the invention is to provide a UV transmission crystal having high thermal stability.

Another object of the invention is to provide an improved missile detection system.

As to other objects and advantages of the invention, will impart the obvious and will impart the apparent from the specification and drawings.

The invention accordingly comprises a product possessing the features, properties and relation of components which will be exemplified in the products hereinafter described, and the scope of the invention will be indicated in the claims.

BRIEF DESCRIPTION OF THE DRAWINGS

For a fuller understanding of the invention, reference is had to the following description, taken in connection with the accompanying drawings, in which.

DETAILED DESCRIPTION OF THE PREFERRED EMBODIMENTS $(NH_4)_2Ni(SO_4)_2.6H_2O$ crystals were prepared and found to have optical properties that are important for UV filters, including good optical transmission at wavelengths below 300 nm and strong absorption at UV wavelengths greater than 350 nm. It was also found that under relevant operating conditions, $(NH_4)_2Ni(SO_4)_2.6H_2O$ crystal elements with polished surfaces are stabile at temperatures up to 125° C. for extended and perhaps indefinite time periods.

$(NH_4)_2Ni(SO_4)_2.6H_2O$ crystals were also found to have very favorable mechanical properties that permit them to be machined and polished more easily than many other crystals operating in the same frequency bands.

Single crystals of $(NH_4)_2Ni(SO_4)_2.6H_2O$ large enough for practical applications in UV filters can be grown from aqueous solutions formed by mixing $(NH_4)_2Ni(SO_4)_2$ and $NiSO_4.6H_2O$ in water.

The following examples can be used to prepare $(NH_4)_2Ni(SO_4)_2.6H_2O$ crystals in accordance with the invention, to characterize such crystals, to evaluate their thermal stability and to illustrate their use. These examples are presented for purposes of illustration only and are not to be construed in a limiting sense.

EXAMPLE 1

Preparation of $(NH_4)_2Ni(SO_4)_2.6H_2O$ Feed Stock

A dry mixture of $NiSO_4.6H_2O$ and anhydrous $(NH_4)_2SO_4$ was prepared in a 1:1 molar ratio. The mixture was dissolved in pure distilled water, which had been preheated to 65° C., to a concentration of 400 grams of the mixture per one liter of water. $(NH_4)_2Ni(SO_4)_2.6H_2O$ crystals were precipitated on the bottom of the vessel by gradual cooling of the solution to room temperature over a 48 hour period. The remaining solution was decanted and the crystals were collected to serve as feedstock for crystal growth.

EXAMPLE 2

Preparation of Solution for Crystal Growth

The $(NH_4)_2Ni(SO_4)_2.6H_2O$ feed stock was dissolved in pure distilled water to a concentration of 375 grams per liter of water, to reach saturation at a temperature approaching 60° C. Thereafter, the prepared solution was filtered using a pump and a 0.2 micron filter to remove foreign particles and lint.

EXAMPLE 3

Preparation of Seed Crystals

Figure 1A:
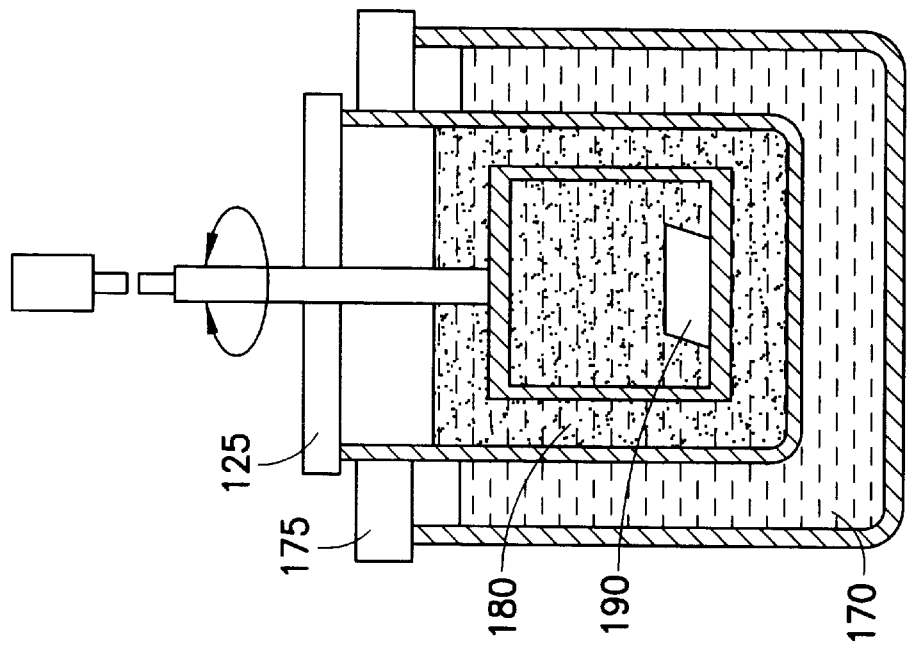
FIG. 1 is a schematic diagram of an $(NH_4)_2Ni(SO_4)_2.6H_2O$ crystal growing on a platform.
Figure 1B:
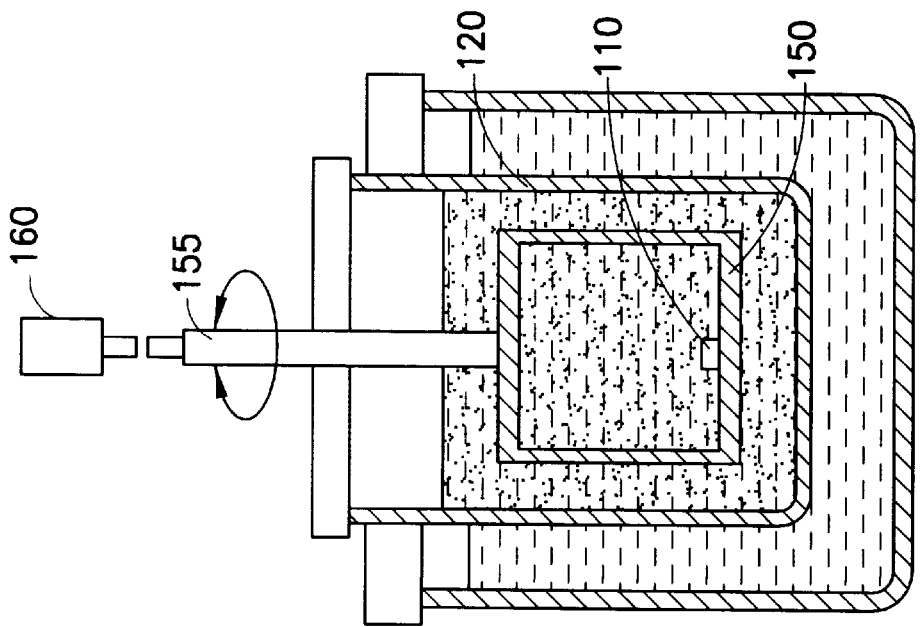

A seed 110 was prepared by cutting a section from a previously grown single crystal of $(NH_4)_2Ni(SO_4)_2 \cdot 6H_2O$ and was attached to an acrylic platform 150, as shown in FIG. 1a. Platform 150 having seed crystal 110 thereon was mounted in a crystal growth tank 120 and a platform shaft 155 which is coupled to platform 150 was connected to an AC motor 160 using a flexible coupling.

EXAMPLE 4

Growth of $(NH_4)_2Ni(SO_4)_2 \cdot 6H_2O$ Single Crystals

Growth of $(NH_4)_2Ni(SO_4)_2 \cdot 6H_2O$ single crystals was conducted in a crystal growth tank 120, which was a 5 liter glass jar, sealed with a tight lid 125 and positioned inside a water bath 170 having a lid 175 thereon. The temperature of the water in the bath was controlled using a submerged heater (not shown) and a precision temperature controller (not shown) with a resolution of 0.01° C.

A slightly overheated crystal growth solution 180, having a temperature slightly above 60° C., was transferred into growth tank 120 using a Teflon pump (not shown). The bath temperature was then lowered to reach the saturation temperature, which is approximately 60° C.

Growth of an $(NH_4)_2Ni(SO_4)_2 \cdot 6H_2O$ single crystal was achieved by gradually lowering the solution temperature. A cooling rate of 0.05° C. per day was used during the first two days and the cooling rate was then gradually increased to 2° C. per day by the end of the growth run. Up to five weeks has been required to grow a crystal 190, having a 7 cm×6 cm cross section and a 4 cm thickness.

As understood by those of ordinary skill in the art, the temperatures, cooling rates and growth times used in this example can be varied and still achieve acceptable crystal growth. However, it is preferred to employ these parameters within plus or minus 10% of the stated values.

EXAMPLE 5

Crystal Characterization

The crystal composition was confirmed by elemental chemical analysis and by the x-ray powder phase analysis method. The x-ray powder pattern produced using a Phillips APD diffractometer was compared with those found in the APD database and showed a very good match. The monoclinic crystal structure and the lattice parameters of $(NH_4)_2Ni(SO_4)_2 \cdot 6H_2O$ were confirmed to be: a=9.19 Å, b=12.47 Å, c=6.24 Å, and β=107°.

Figure 2:
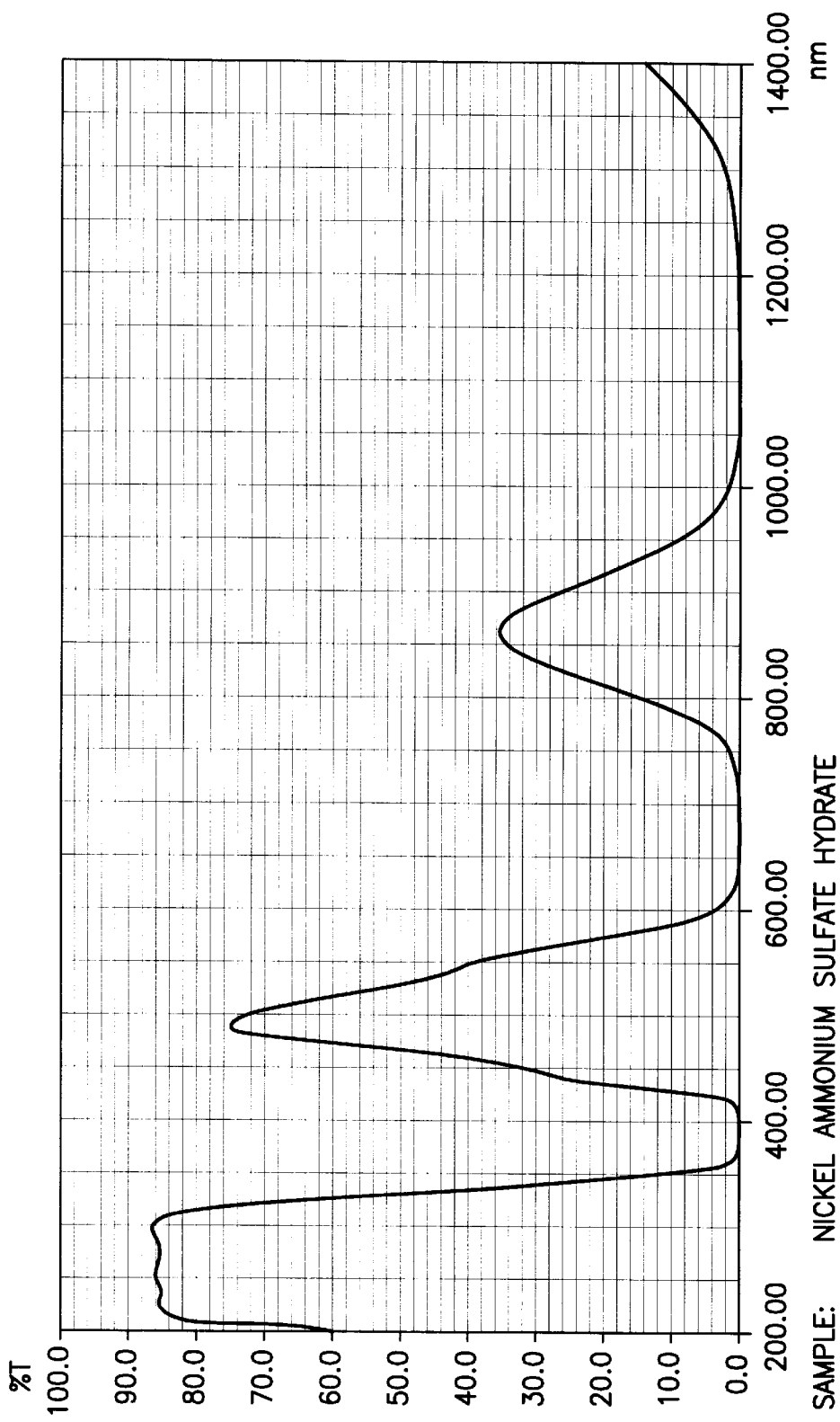
FIG. 2 is an optical transmission curve for an $(NH_4)_2Ni(SO_4)_2.6H_2O$ crystal.

The optical transmission of the $(NH_4)_2Ni(SO_4)_2 \cdot 6H_2O$ crystal was measured using a Hitachi 4001 spectrophotometer. The optical transmission for a 4 mm thick plate cut from one of the grown $(NH_4)_2Ni(SO_4)_2 \cdot 6H_2O$ single crystals is presented in FIG. 2. The spectrum demonstrates high UV transmission at wavelengths between 200 and 300 nm and strong absorption of UV light at wavelengths above 350 nm.

EXAMPLE 6

Thermal Stability in a Sealed Ampoule

Under equilibrium conditions, loss of water of crystallization in a crystal hydrate occurs when the equilibrium water pressure over the crystal exceeds the partial pressure of water vapor in the ambient. However, under the conditions of a thermogravimetric analysis (TGA) measurement or in an oven test, the decomposition threshold depends not only on temperature, but on other parameters as well, including the atmosphere humidity, heating rate, ratio of the crystal volume to its surface and the status of the crystal surfaces (natural facets, cut, ground or polished). In TGA and oven tests conducted in U.S. Pat. Nos. 5,837,054, 5,788,765 and 5,742,428, where these important parameters were not specified, the results are difficult to interpret. Experiments show that TGA measurements and oven tests, unless they are carried out under rigidly defined conditions, are not reliable indicators of crystal stability at elevated temperatures.

The thermal stability of $(NH_4)_2Ni(SO_4)_2 \cdot 6H_2O$ crystals was evaluated in comparison with other known UV filter materials, including $NiSO_4 \cdot 6H_2O$, $NiSiF_6 \cdot 6H_2O$ (U.S. Pat. No. 5,837,054), and $K_2Ni(SO_4)_2 \cdot 6H_2O$ (U.S. Pat. No. 5,788, 765). No attempts to evaluate $Ni(BF_4)_2 \cdot 6H_2O$ (U.S. Pat. No. 5,742,428) were made because this crystal was found to be deliquescent and, therefore, has no practical application.

In a first test, an element 20 mm in diameter and 6 mm thick was cut from one of the grown single crystals of $(NH_4)_2Ni(SO_4)_2 \cdot 6H_2O$, and its flat surfaces were polished. The $(NH_4)_2Ni(SO_4)_2 \cdot 6H_2O$ element was placed into a thick-walled quartz ampoule together with $NiSO_4 \cdot 6H_2O$, and $K_2Ni(SO_4)_2 \cdot 6H_2O$, and $NiSiF_6 \cdot 6H_2O$ elements of the same size, which were cut and polished in a similar fashion from as-grown single crystals. The ampoule was evacuated to 600 mm of absolute pressure and sealed off. The sealed ampoule was placed into an oven and heated to 50° C. Following this, the temperature was increased in 5° C. increments, and the ampoule soaked at each temperature for 72 hours. Thus, during the test, all crystals under study were at the same temperature and humidity.

Changes in the appearance of the crystals were observed through a glass door of the oven. Crystal decomposition was detected as emergence of yellow spots on the surface of the green crystal. This test showed that $NiSO_4 \cdot 6H_2O$ was the first crystal to decompose at 70° C. It was followed by $NiSiF_6 \cdot 6H_2O$ at 90° C. and $K_2Ni(SO_4)_2 \cdot 6H_2O$ at 105° C. $(NH_4)_2Ni(SO_4)_2 \cdot 6H_2O$ exhibited the highest thermal stability, was stable above and below the 110° C. to 130° C. range and showed first signs of decomposition at 135°.

EXAMPLE 7

Stability in a Climate Chamber

Figure 3:
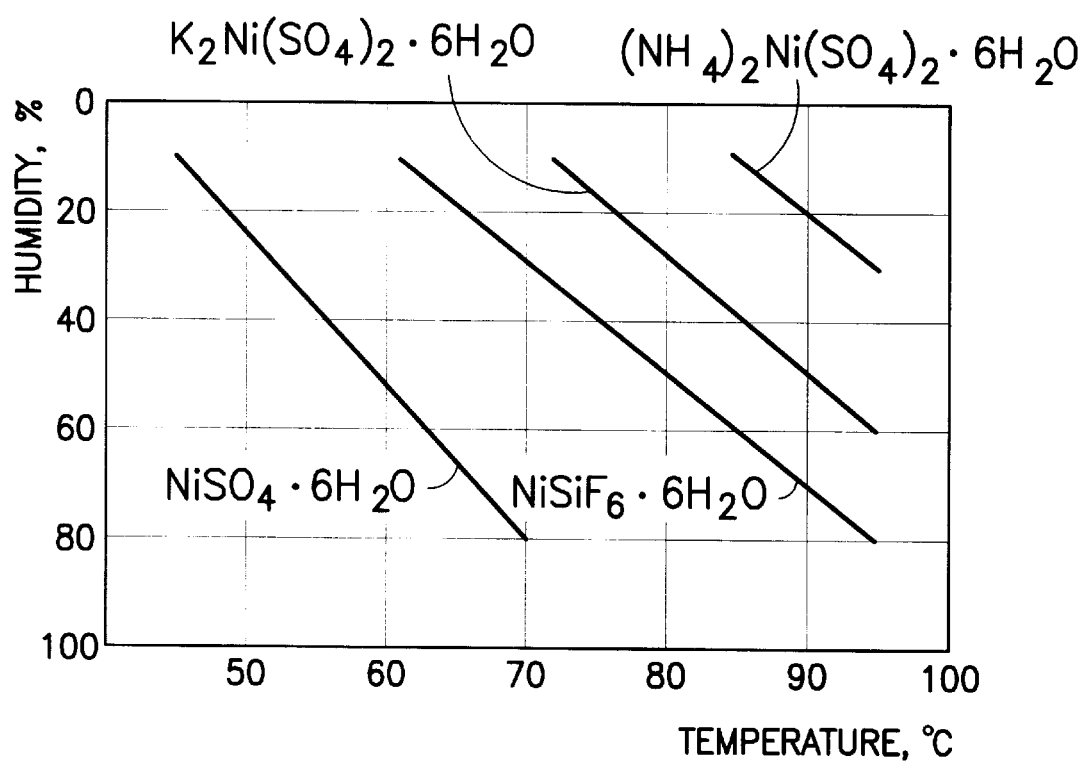
FIG. 3 is a graph showing the thermal stability of an $(NH_4)_2Ni(SO_4)_2.6H_2O$ crystal in accordance with the invention.

In a second test, the thermal stability of $(NH_4)_2Ni(SO_4)_2 \cdot 6H_2O$, $NiSO_4 \cdot 6H_2O$, $NiSiF_6 \cdot 6H_2O$ and $K_2Ni(SO_4)_2 \cdot 6H_2O$ was evaluated in a climate chamber. The chamber could be programmed to achieve a desired combination of temperature (between 45° and 95°) and humidity (between 10 and 80%). The onset of thermal decomposition corresponded to the appearance of yellow spots on the crystal surface. The results of the climate stability test are presented in FIG. 3. Each line in FIG. 3. represents a boundary of thermal stability for a compound; namely, the compound is stable below and to the left of the representative line and decomposes above and to the right of it. The data in FIG. 3 show that the thermal stability of $(NH_4)_2Ni(SO_4)_2 \cdot 6H_2O$ is the highest among all crystals studied.

EXAMPLE 8

Stability in an Enclosed System

In a third test, the thermal stability of $(NH_4)_2Ni(SO_4)_2 \cdot 6H_2O$ was determined under conditions similar to those in a sealed UV filter in which the crystal would be used. An $(NH_4)_2Ni(SO_4)_2 \cdot 6H_2O$ test element was loaded into a 100 ml glass beaker, closed with a tight glass stopper. Then, the beaker was placed in an oven and heated to 50° C. Following this, the temperature was increased in 5° C. increments, and the furnace soaked at each temperature for 72 hours. Under these conditions, the crystal was stable at temperatures over 105° C. and to 125° C. At 125° C., the crystal was soaked for 2 weeks without any visible signs of decomposition.

EXAMPLE 9

Use in a Solar-Blind Optical System

Figure 4:
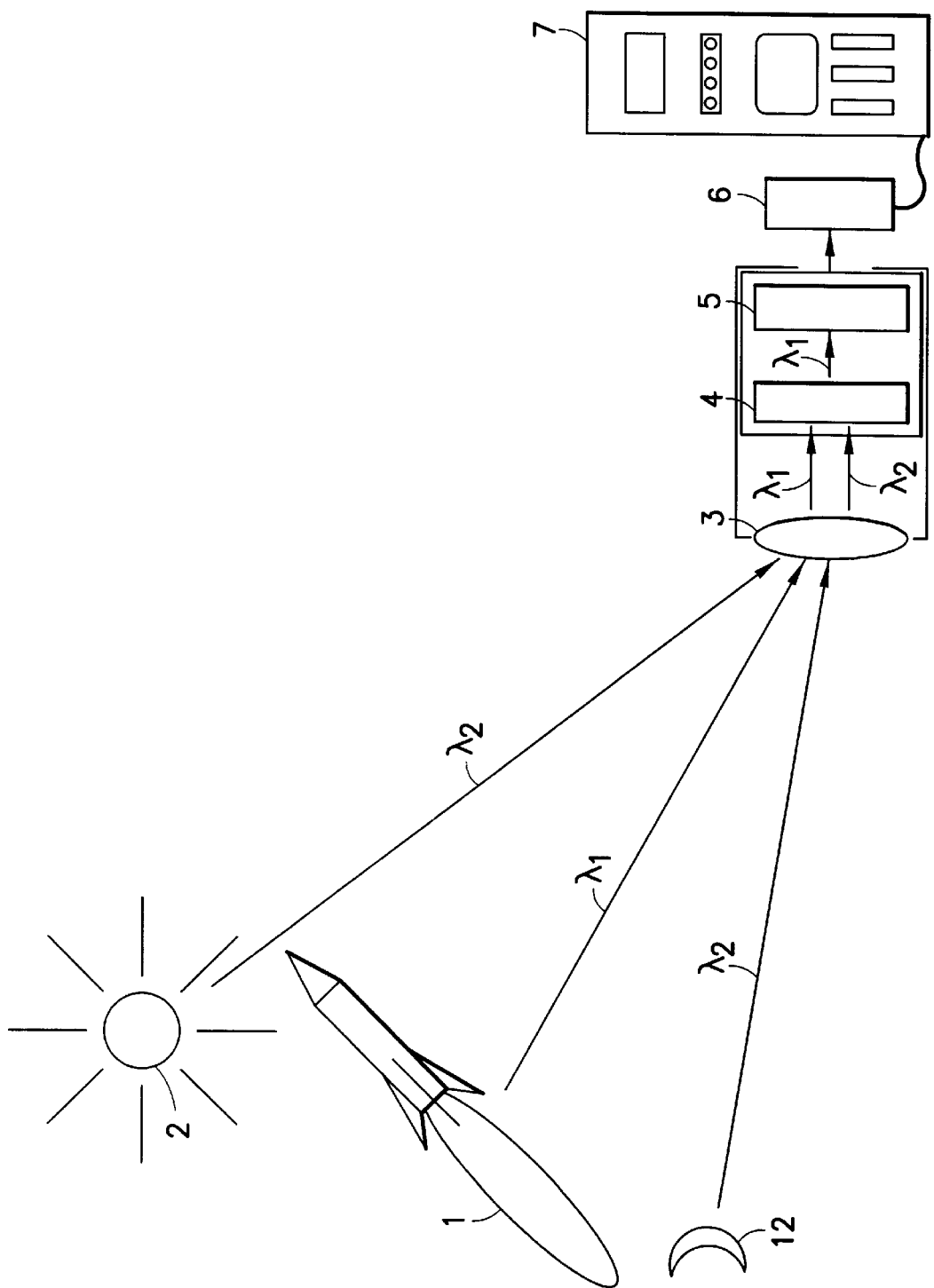
FIG. 4 is a schematic diagram of a solar-blind optical sensor which utilizes an $(NH_4)_2Ni(SO_4)_2.6H_2O$ crystal in accordance with the invention.

A schematic diagram of a solar-blind optical system utilizing the crystal of the present invention is presented in FIG. 4. An exhaust plum of a jet engine 1 emits UV light of a wavelength $\lambda_1$, which, together with broad spectrum light of a wavelength $\lambda_2$ originating from natural sources (noise) such as the sun 2 and the moon 12 is collected by a lens 3. The mixed light containing the useful signal at $\lambda_1$ and the noise at $\lambda_2$ is forwarded to a UV filter 4, which utilizes an $(NH_4)_2Ni(SO_4)_2 \cdot 6H_2O$ crystal as a component. The filter rejects $\lambda_2$ and transmits $\lambda_1$ to other components 5 known in the art, and then to a sensor 6. The electronic signal developed by sensor 6 is amplified, processed, analyzed and displayed in an electronic circuitry 7.

Although certain preferred embodiments of the crystals, methods of making the crystals and devices, which utilize that crystal have been described, it should be understood that the invention is not limited thereto, but may be variously embodied within the scope of the following claims.

It is also to be understood that the following claims are intended to cover all of the generic and specific features of the invention herein described and all statements of the scope of the invention which, as a matter of language, might be said to fall therebetween.

Particularly it is to be understood that in said claims, ingredients or compounds recited in the singular are intended to include compatible mixtures of such ingredients wherever the sense permits.

What is claimed is:

1. An UV light filter comprising a single crystal of the formula $(NH_4)_2Ni(SO_4)_2 \cdot 6H_2O$.

2. The filter of claim 1, wherein the crystal transmits UV light in the band 200 to 300 nm and blocks light at UV wavelengths greater than 350 nm.

3. The filter of claim 1, wherein the crystal has a diameter of at least 1 cm.

4. An UV light sensor, comprising: a crystal with the formula $(NH_4)_2Ni(SO_4)_2 \cdot 6H_2O$ which is thermally stable up to about 125° C. in an enclosed system and transmits UV light with wavelengths below 300 nm; optical elements; and electronics which generate a signal from the transmitted UV light passed by the crystal to indicate the detection of light in the 200 to 300 nm range.

5. A missile early warning system, comprising a crystal with the formula $(NH_4)_2Ni(SO_4)_2 \cdot 6H_2O$ which transmits UV light with wavelengths below 300 nm; optical elements; and electronics which generate a signal from the transmitted UV light passed by the crystal to indicate the detection of light in the 200 to 300 nm range.

6. A missile early warning system, comprising a $(NH_4)_2Ni(SO_4)_2 \cdot 6H_2O$ crystal thermally stable up to about 125° C. in an enclosed system, wherein said enclosed system is a system which is sealed to prevent loss of moisture from the crystal to the environment outside of said enclosed system, said crystal being substantially transparent to UV light in the 200 to 300 nm band and substantially absorbing UV light at 350 to 400 nm; optical elements; and electronics which generate a signal from the transmitted UV light passed by the crystal to indicate the detection of light in the 200 to 300 nm range.

* * * * *